United States Patent [19]

Tsuda et al.

[11] 4,243,740
[45] Jan. 6, 1981

[54] LIGHT SENSITIVE COMPOSITIONS OF POLYMETHYL ISOPROPENYL KETONE

[75] Inventors: Minoru Tsuda, Isehara; Yoichi Nakamura; Hideo Nagata, both of Samukawa; Hisashi Nakane, Kawasaki, all of Japan

[73] Assignee: Tokyo Ohka Kogyo Kabushiki Kaisha, Kawasaki, Japan

[21] Appl. No.: 21,253

[22] Filed: Mar. 16, 1979

[30] Foreign Application Priority Data

Mar. 22, 1978 [JP] Japan ............................ 53-32501

[51] Int. Cl.³ .................. G03C 1/68; C08F 8/00
[52] U.S. Cl. ..................... 430/270; 204/159.14; 204/159.22; 430/311; 430/322; 430/918; 526/316
[58] Field of Search ............ 96/115 R; 204/159.22, 204/169.23, 159.14; 526/316; 430/270, 296, 313, 311, 323, 326, 940, 942, 918, 913

[56] References Cited

U.S. PATENT DOCUMENTS

| | | | |
|---|---|---|---|
| 3,444,208 | 5/1969 | McClure | 526/316 |
| 3,860,538 | 1/1975 | Guillet et al. | 526/316 |
| 3,915,269 | 12/1975 | Miyoshi et al. | 526/316 |
| 4,008,138 | 2/1977 | Rosen et al. | 96/115 P |
| 4,012,536 | 3/1977 | Levine et al. | 430/270 |

OTHER PUBLICATIONS

Shultz, Journal of Polymer Science 47, pp. 267-276, (1960).
Heskins et al., "Ultraviolet Light Induced Reactions in Polymers", ACS Symposium, series No. 25, pp. 281-289, (1976).
Levine, Technical Papers, Photo-Polymers, Oct. 24-26, 1973, Published Science of Plastics Engineers, Inc.
Lin, IBM Jour. of Research and Development 20 (3), pp. 213-221, (1976).
Lin, Jour. of the Vacuum Science and Technology, 12 (6), pp. 1317-1320, (1975).
Wissbrum, Jour. of American Chemical Society, vol. 8, pp. 58-62, (1959).

Primary Examiner—Jack P. Brammer
Attorney, Agent, or Firm—Armstrong, Nikaido, Marmelstein & Kubovcik

[57] ABSTRACT

A sensitive composition comprising polymethyl isopropenyl ketone of limited molecular weight and a compound of a given general formula. The formation of a pattern of less than 1 μm is made possible by employing ultraviolet rays of wave lengths of 100-350 nm in place of those of 350-450 nm utilized in conventional processes. The sensitive composition is highly sensitive to ultraviolet rays in said wave range and reproduces a fine pattern precisely.

22 Claims, 13 Drawing Figures

LIGHT SENSITIVE COMPOSITIONS OF POLYMETHYL ISOPROPENYL KETONE

BACKGROUND OF THE INVENTION (1) Field of the Invention:

The present invention relates to light sensitive compositions, more particularly, to compositions comprising highly sensitized polymethyl isopropenyl ketone which is a photoresist for fine pattern processing.

(2) Prior Art:

Recently, for the development of super LSI, lithography of a precision of up to submicron units attracts public attention. However, according to conventional photolithography, patterns of less than 1 μm cannot be formed due to phenomena such as diffraction and interference of light, since ultraviolet rays having wave lengths of from 350 to 450 nm are used. Under the circumstances as above, techniques of electron beam exposure and soft X-ray exposure are now being developed. However, the electron beam exposure technique has disadvantages in that a large-sized computer is used and a long exposure time is required. Therefore, this technique is impractical for wafer transfer. In the soft X-ray exposure technique, there is no practical light source and mask fitting is very difficult. Further, in both techniques, devices necessitated are very large in size and extremely expensive.

If the ultraviolet rays of wave lengths of 350–450 nm employed in the conventional photolithography can be replaced with ultraviolet rays of shorter wave lengths of 100–350 nm, formation of ultrafine images or patterns of less than 1 μm, is made possible, the conventional lithographic techniques can be used, and light sources such as low pressure mercury lamps, heavy hydrogen lamps and xenon-mercury lamps can be used. Therefore, this is economical and most practical for forming ultrafine images.

After intensive investigation on the techniques of forming ultrafine patterns by irradiation with ultraviolet rays of having wave lengths of from 100 to 350 nm, from this point of view, the inventors found previously that polymethyl isopropenyl ketone has a high sensitivity to ultraviolet rays of wave lengths of 100-350 nm and that a composition comprising the polymethyl isopropenyl ketone combined together with a benzophenone derivative exhibits a higher sensitivity and acts as a resist suitable for the preparation of super LSI (German Patent Application No. P.28 47 764.7 and U.S. application Ser. No. 961,120, filed Oct. 16, 1978.).

Figure 1:
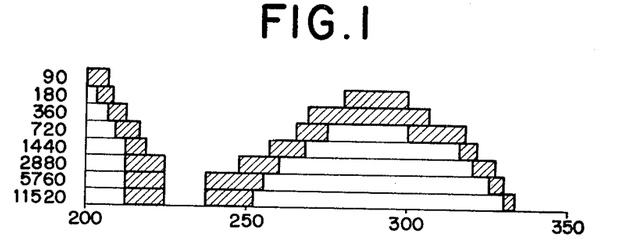
FIG. 1 shows spectral sensitivity of polymethyl isopropenyl ketone (free of sensitizer).

FIG. 1 shows spectral sensitivity of polymethyl isopropenyl ketone. The sensitivity range of polymethyl isopropenyl ketone is divided into two parts. Particularly, in a range of wave lengths of 210-260 nm, a high sensitivity is not necessarily shown. Consequently, it is considered that if a sensitizer which increases sensitivity in the wave length range of 210-260 nm and, further, in a wider range is found, an effective spectrum sensitization is possible from the viewpoint of wave length characteristics of xenon-mercury lamp, etc.

SUMMARY OF THE INVENTION

An object of the present invention is to provide a light sensitive composition having a high sensitivity to ultraviolet rays of short wave length of 100-350 nm.

Another object of the present invention is to provide a light sensitive composition with which photolithography can be effected economically by using ultraviolet rays of short wave lengths obtained from a low pressure mercury lamp, heavy hydrogen lamp or xenon-mercury lamp and a pattern of less than 1 μm can be formed.

Still another object of the present invention is to provide a light sensitive composition containing polymethyl isopropenyl ketone have a remarkably increased sensitivity.

The light sensitive composition according to the present invention is characterized by comprising polymethyl isopropenyl ketone of a molecular weight of about 10,000–about 1,000,000 and a compound having the general formula:

wherein $X_1$, $X_2$ and $X_3$ independently represent hydrogen atom, an alkyl group, hydroxyl group, an alkoxyl group or a halogen atom, Y represents hydrogen atom or a group having the formula: —COOR (R being hydrogen atom or an alkyl group), Q represents hydrogen atom, an alkyl group or a lower hydrocarbon chain which may be substituted with hydroxyl group and n represents an integer of at least 1.

DETAILED DESCRIPTION OF THE INVENTION

As described above, the composition of the present invention is a light sensitive composition characterized by comprising polymethyl isopropenyl ketone of a molecular weight of about 10,000—about 1,000,000 and benzoic acid, a substituted benzoic acid or an ester thereof of general formula (I).

Polymethyl isopropenyl ketone which is a sensitive resin (photoresist) and which is a principal component of the composition of the present invention is a polymer of a molecular weight of about 10,000—about 1,000,000 obtained by polymerization of methyl isopropenyl ketone.

The composition is shaped into a film having a thickness of usually about 0.3–1 μm and irradiated with ultraviolet rays having a wave length in the range of 100-350 nm through a mask pattern with a base which transmits ultraviolet rays having a wave length in the range of 100-350 nm such as quartz base. The exposed parts are decomposed and, thereby, become easily soluble in a suitable solvent such as a solvent mixture of cyclohexanone and a cellosolve solvent. Thus, the intended resist image is obtained. If a compound of general formula (I) is incorporated as a sensitizer in the polymethyl isopropenyl ketone, the decomposition is accelerated remarkably without reduction in resolving power as compared with the case of using polymethyl isopropenyl ketone alone. Increased sensitivity of about 30 times as high as usual is observed in the case of using an ultraviolet ray having a wave length of 253.7 nm.

The greatest characteristic feature of the present invention is that the composition contains benzoic acid, a substituted benzoic acid or an ester thereof of general formula (I) as sensitizer. Many of compounds of general formula (I) are accessible on the market as commercial chemicals and, in addition, they are cheap.

Compounds of general formula (I) will be classified into the following groups and examples of them will be given.

(I)

Group (a):

Compounds of general formula (I) wherein $X_1$ represents hydrogen atom or an alkyl group, preferably an alkyl group of 1–8 carbon atoms, $X_2$, $X_3$, Y and Q represent hydrogen atom, and n represents 1, i.e. compounds of following general formula (II):

(II)

As examples of compounds of group (a), there may be mentioned benzoic acid, o-methyl, m-methyl, p-methyl, p-isopropyl, p-n.-butyl, p-tert.-butyl, p-n.amyl and p-n.-octylbenzoic acid.

Group (b):

Compounds of general formula (I) wherein $X_1$ represents hydroxyl group, $X_2$ and $X_3$ independently represent hydrogen atom or hydroxyl group, Q represents hydrogen atom or an alkyl group, preferably an alkyl group of 1–5 carbon atoms, Y represents hydrogen atom and n represents 1, i.e. compounds of following general formula (III):

(III)

As examples of compounds of group (b), there may be mentioned p-hydroxybenzoic acid and its methyl and dodecyl esters, 2,4-, 3,4- and 3,5-dihydroxybenzoic acid, ethyl, propyl and isoamyl gallates and protocatechuic acid.

Group (c):

Compounds of general formula (I) wherein $X_1$ represents an alkoxyl group, preferably an alkoxyl group of 1–5 carbon atoms, $X_2$ independently represents hydrogen atom or an alkoxyl group, preferably an alkoxyl group of 1–5 carbon atoms, $X_3$, Y and Q represent hydrogen atom and n represents 1, i.e. compounds of following general formula (IV):

(IV)

As examples of compounds of group (c), there may be mentioned o-methoxy-, p-methoxy, 3,4-dimethoxy-, p-ethoxy-, p-n.-amyloxy- and 3,4-di-n.-amyloxybenzoic acids and anisic acids.

Group (d):

Compounds of general formula (I) wherein $X_1$ represents a halogen atom, preferably chlorine or bromine atom, $X_2$ independently represents hydrogen atom or a halogen atom, preferably chlorine or bromine atom, $X_3$, Y and Q each represent hydrogen atom and n represents 1, i.e. compounds of following general formula (V):

(V)

As examples of compounds of group (d), there may be mentioned p-chloro-, 2,4-dichloro-, 3,4-dichloro- and p-bromobenzoic acids.

Group (e):

Compounds of general formula (I) wherein $X_1$, $X_2$ and $X_3$ each represent hydrogen atom, Y represents —COOR, Q and R independently represent hydrogen atom or an alkyl group, preferably an alkyl group of 1–8 carbon atoms and n represents 1, i.e. compounds of following general formula (VI):

(VI)

As examples of compounds of group (e), there may be mentioned terephthalic acid, dimethyl terephthalate, dibutyl phthalate and dioctyl phthalate.

Group (f):

Compounds of general formula (I) wherein $X_1$ represents an alkyl group, preferably an alkyl group of 1–8 carbon atoms, Q represents an alkyl group of 1–12 carbon atoms, preferably a hydrocarbon chain of 2–5 carbon atoms which may be substituted with hydroxyl group and n represents an integer of 2–4, i.e. compounds of general formula (VII):

(VII)

As examples of compounds of group (f), there may be mentioned dodecyl ester, ethylene glycol diester, propylene glycol diester, 1,4-butanediol diester, glycerol diester, glycerol triester and pentaerythritol di-, tri- and tetraesters of p-tert.-butyl benzoic acid, and methyl ester of p-n.octylbenzoic acid.

Group (g):

Compounds of general formula (I) wherein $X_1$ and $X_2$ independently represent an alkoxyl group, preferably an alkoxyl group of 1-5 carbon atoms, $X_3$ and Y represent hydrogen atom, Q represents an alkyl group of 1-12 carbon atoms, preferably a hydrocarbon chain of 2-5 carbon atoms which may be substituted with hydroxyl group and n represents an integer of 2-4, i.e. compounds of following general formula (VIII):

(VIII)

As examples of compounds of group (g), there may be mentioned dodecyl ester, ethylene glycol diester, propylene glycol diester, 1,4-butanediol diester, glycerol di- and triesters and pentaerythritol di-, tri- and tetraesters of 3,4-dimethoxybenzoic acid and dodecyl ester of 3,4-di-n.-amyloxybenzoic acid.

Sensitizers of general formula (I) contained in the compositions of the present invention have been illustrated above by classifying them into groups. However, the sensitizers in the composition of the present invention are not limited to those given above as examples but include all compounds defined by general formula (I).

In the compounds of general formula (I), substituted benzoic acids having a hydroxyl group, an alkyl group or an alkoxy group on the aromatic nucleus and esters thereof are particularly excellent. The compounds of general formula (I) can be used alone or in combination of two or more of them.

The compounds of general formula (I) are used generally in an amount in the range of from about 0.01 to 50 parts by weight and preferably, from about 1 to 25 parts by weight per 100 parts by weight of polymethyl isopropenyl ketone.

According to a preferred embodiment of the use of the composition of the present invention, a solution of a mixture of polymethyl isopropenyl ketone and a compound having the general formula (I) in a suitable solvent such as cyclohexanone is applied to a base such as a silicon wafer with a spinner or the like, then dried to form a resist layer having a thickness of 0.3-1 μm. The resulting film is subjected to an image forming exposure treatment with a light source which emits rays having wave lengths of from 100 to 350 nm such as low pressure mercury lamps, heavy hydrogen lamps, high pressure mercury lamps, ultra-high pressure mercury lamps, arc lamps, xenon lamps or xenon-mercury lamps through a mask pattern by using a base material which transmits light within said range of wave lengths such as LiF, MgF$_2$, CaF$_2$, BaF$_2$, Al$_2$O$_3$ or SiO$_2$. The film is then immersed in a developing solution such as a mixture of cyclohexanone and a cellusolve solvent to effect elution of the parts in which molecular weight has been reduced by the exposure, thereby obtaining a very fine pattern on the surface of the base material.

Now, the description will be made on effects of the compositions of the present invention. As described in the above column of introduction of prior art with reference to FIG. 1, sensitivity range of polymethyl isopropenyl ketone is divided into two parts. Particularly, in a wave length range of 210-260 nm, a high sensitivity is not necessarily shown. By incorporating the compound of general formula (I) of the present invention therein, the composition exhibits a remarkably high sensitivity not only in the ultraviolet ray region of wave length range of 210-260 nm but also in a wider range as shown in FIGS. 2-12 and, in addition, it reproduces a fine pattern faithfully.

Figure 2:
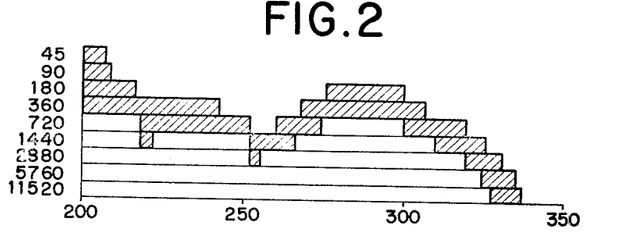
FIGS. 2 through 12 show spectral sensitivities of light sensitive compositions of the present invention.
Figure 3:
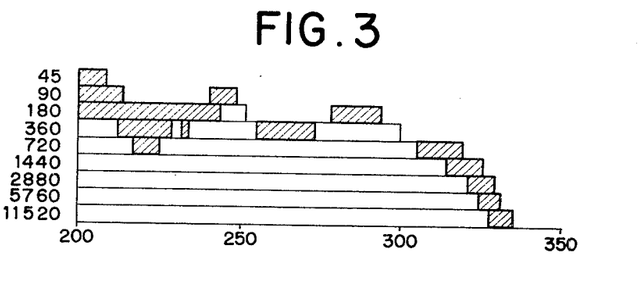
Figure 4:
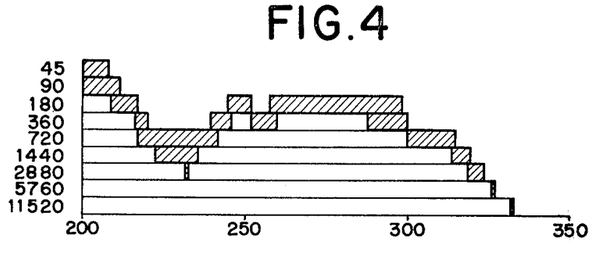
Figure 5:
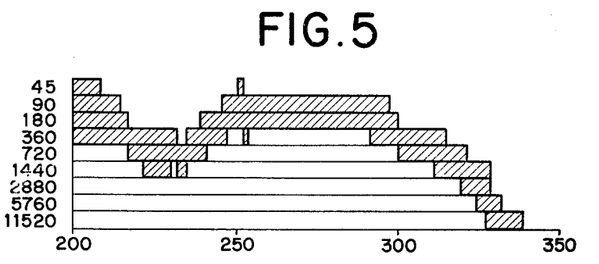
Figure 6:
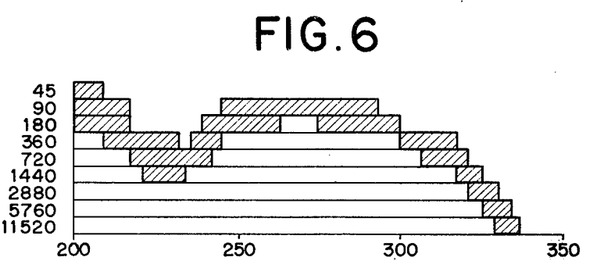
Figure 7:
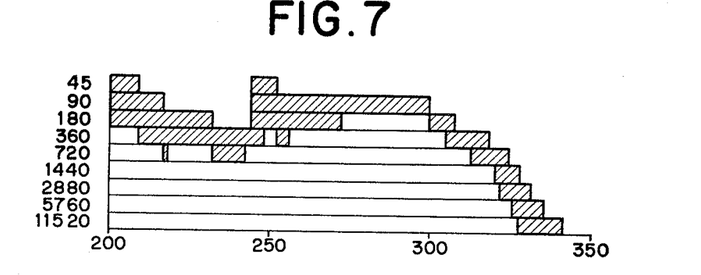
Figure 8:
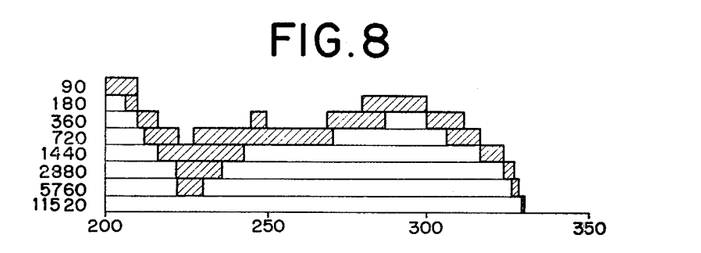
Figure 9:
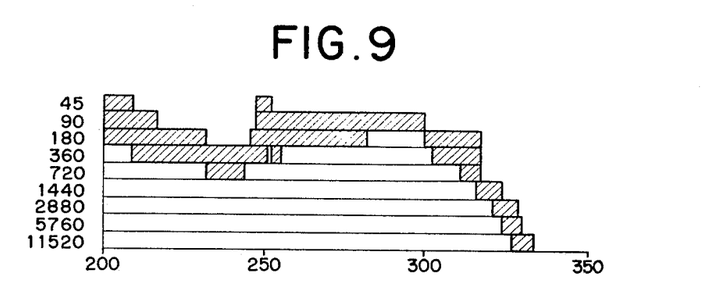
Figure 10:
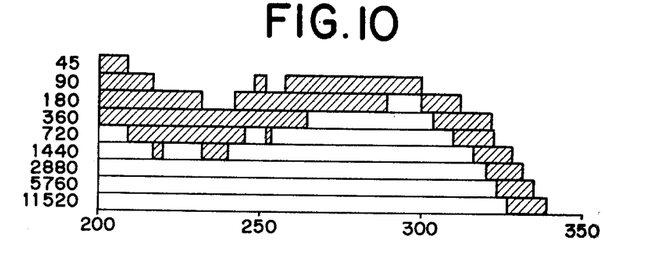
Figure 11:
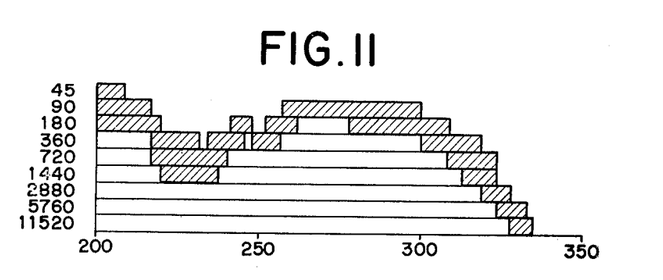
Figure 12:
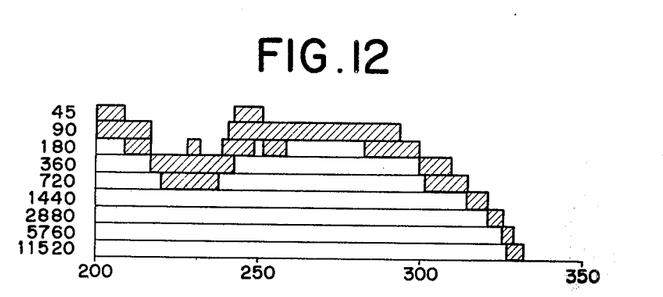

Experimental methods of FIGS. 1 and 2 will be illustrated in Example 2. In the figures, the ordinates indicate exposure count numbers and the abscissae indicate wave lengths (unit: nm). A blank part in the histogram indicates a part in which a base was exposed after sensitization followed by decomposition of the photoresist and development. A oblique-lined part indicates a part of half-tone in which sensitization was unsatisfactory. FIG. 9 shows a case in which a combination of two compounds was used.

Spectral sensitivity ranges shown in FIGS. 1-12 vary somewhat depending on the sensitizers employed. Therefore, more effective spectral sensitization is possible by selecting a sensitizer most suitable for the wave length distribution of light emitted by a particular light source.

As will be described in detail in examples given below, the light sensitive composition has an excellent film forming property, a high resolving power, excellent corrosion resistance and other properties desirable as a resist for fine pattern processing. Though wave lengths actually measured were up to 170 nm, the absorption range of the composition comprising polymethyl isopropenyl ketone and the sensitizer extends to a shorter wave lengths. Therefore, the composition is considered to be also sensitive to light having such short wave lengths.

If the composition of the present invention is used, exposure time, which has been a great problem in far ultraviolet lithography (an effective process for ultrafine processing such as super LSI), can be reduced remarkably. Consequently, the treatment can be completed within a period of time substantially equivalent to that required for photoresist processes currently employed in the art, whereby far ultraviolet lithography can be put to practical use.

Although the present invention shall be described in detail by giving the examples as following, it shall not be limited of its scope by these examples.

EXAMPLE 1

100 Parts by weight of polymethyl isopropenyl ketone having a molecular weight of 176,000 were dissolved in cyclohexanone to obtain a solution having a concentration of 10 weight %. 10 Parts by weight of a compound shown in Table 1 were added to the solution and the mixture was subjected to filtration through a filter of 0.2 μm to obtain a sensitizing solution. The sensitizing solution was then applied to a silicon wafer with a spinner. A resist layer having a thickness of about 0.5 μm was thus formed thereon and the resulting wafer was baked at 80° C. for 30 minutes to remove the solvent completely. The photo-sensitive materials thus obtained were exposed stepwise with a commercially available germicidal lamp which radiates ultraviolet rays of 253.7 nm wavelength, from a distance of 5.5 cm.

Then, the silicon wafer was immersed in a developing solution comprising ethyl cellosolve and cyclohexanone for one minute to effect the development, washed with water for one minute and dried. Sensitivity was determined from number of residual steps. The results are shown in Table 1. Relative sensitivity in the table is a relative value based on sensitivity (10) of polymethyl isopropenyl ketone. The remaining rate of the film in the non-exposed parts was more than 90% after the development.

TABLE 1

| No. | Sensitizer | Group | Relative sensitivity |
|---|---|---|---|
| 1 | None (PMIPK) | — | 10 |
| 2 | Benzoic acid | a | 23 |
| 3 | p-Chlorobenzoic acid | d | 30 |
| 4 | 2,4-Dichlorobenzoic acid | d | 30 |
| 5 | 3,4-Dichlorobenzoic acid | d | 30 |
| 6 | p-Bromobenzoic acid | d | 40 |
| 7 | p-Hydroxybenzoic acid | b | 80 |
| 8 | 2,4-Dihydroxybenzoic acid | b | 23 |
| 9 | 3,4-Dihydroxybenzoic acid | b | 171 |
| 10 | 3,5-Dihydroxybenzoic acid | b | 23 |
| 11 | Ethyl gallate | b | 30 |
| 12 | Propyl gallate | b | 30 |
| 13 | Isoamyl gallate | b | 30 |
| 14 | Methyl p-hydroxybenzoate | b | 218 |
| 15 | Dedecyl p-hydroxybenzoate | b | 133 |
| 16 | 0-Methoxybenzoic acid | c | 40 |
| 17 | p-Methoxybenzoic acid | c | 267 |
| 18 | 3,4-Dimethoxybenzoic acid | c | 100 |
| 19 | p-Ethoxybenzoic acid | c | 133 |
| 20 | p-n-Amyloxybenzoic acid | c | 240 |
| 21 | o-Methylbenzoic acid | a | 40 |
| 22 | m-Methylbenzoic acid | a | 40 |
| 23 | p-Methylbenzoic acid | a | 80 |
| 24 | p-Isopropyl benzoic acid | a | 171 |
| 25 | p-tert.-Butylbenzoic acid | a | 240 |
| 26 | Terephthalic acid | d | 23 |
| 27 | Dimethyl terephthalate | d | 40 |
| 28 | p-n-Butylbenzoic acid | a | 240 |
| 29 | p-n-Amylbenzoic acid | a | 200 |
| 30 | p-n-Octylbenzoic acid | a | 185 |
| 31 | Dodecyl p-tert.-butylbenzoate | f | 235 |
| 32 | Ethylene glycol diester of p-tert.-butylbenzoic acid | f | 240 |
| 33 | Propylene glycol diester of p-tert.-butylbenzoic acid | f | 238 |
| 34 | 1,4-Butane diol diester of p-tert.-butylbenzoic acid | f | 235 |
| 35 | Glycerol diester of p-tert.-butylbenzoic acid | f | 238 |
| 36 | Glycerol triester of p-tert.-butylbenzoic acid | f | 240 |
| 37 | Pentaerythritol diester of p-tert.-butylbenzoic acid | f | 235 |
| 38 | Pentaerythritol triester of p-tert.-butylbenzoic acid | f | 238 |
| 39 | Pentaerythritol tetraester of p-tert.-butylbenzoic acid | f | 240 |
| 40 | Dodecyl 3,4-dimethoxybenzoate | g | 95 |
| 41 | Ethylene glycol diester of 3,4-dimethoxybenzoic acid | g | 100 |
| 42 | Propylene glycol diester of 3,4-dimethoxybenzoic acid | g | 97 |
| 43 | 1,4-Butanediol diester of 3,4-dimethoxybenzoic acid | g | 95 |
| 44 | Glycerol diester of 3,4-dimethoxybenzoic acid | g | 97 |
| 45 | Glycerol triester of 3,4-dimethoxybenzoid acid | g | 100 |
| 46 | Pentaerythritol diester of 3,4-dimethoxybenzoic acid | g | 97 |
| 47 | Pentaerythritol triester of 3,4-dimethoxybenzoic acid | g | 95 |
| 48 | Pentaerythritol tetraester of 3,4-diemthoxybenzoic acid | g | 100 |

EXAMPLE 2

A sensitizing solution was prepared in the same manner as in Example 1. The sensitizing solution was applied to a dry glass plate. After the formation of a resist layer having a thickness of about 0.5 μm thereon, it was baked at 80° C. for 30 minutes to remove the solvent completely. In order to obatin data on the spectral sensitivity, the photo-sensitive, the photo-sensitive material was exposed stepwise through a concave diffraction grating of 200 nm blaze with a 5 kW xenen lamp.

Then, it was immersed in a developing solution comprising a solvent mixture of ethyl cellosolve and cyclohexanone for one minute to effect the development. Thereafter, it was washed with water for one minute and dried. The number of steps required for the dissolution was measured. The light energy was measured by using a vacuum thermocouple. Data obtained after conversion so that the irradiated photon number would be constant at every wave length are shown in FIGS. 1–12. In FIGS. 1–12, ordinates indicate exposure count numbers ($45 \times 2^n$, wherein n is a number of a step, i.e. 0, 1, 2, 3, ... 8).

Sensitizer indicatied in FIGS. 1 to 12 are shown together in Table 2.

TABLE 2

| Figure | Sensitizer |
|---|---|
| 1 | Polymethyl isopropenyl ketone (free of sensitizer) |
| 2 | Benzoic acid |
| 3 | p-tert.-Butylbenzoic acid |
| 4 | p-Hydroxybenzoic acid |
| 5 | Methyl p-hydroxybenzoate |
| 6 | Dodecyl p-hydroxybenzoate |
| 7 | 3,4-Dimethoxybenzoic acid |
| 8 | p-Bromobenzoic acid |
| 9 | A mixture consists of 5 wt. % of Benzoic acid and 5 wt. % of 3,4-Dimethoxy bonzoic acid. |
| 10 | Protocatechuic acid |
| 11 | p-Methoxybenxoic acid |
| 12 | p-n-Amyloxybenxoic acid |

EXAMPLE 3

Figure 13:
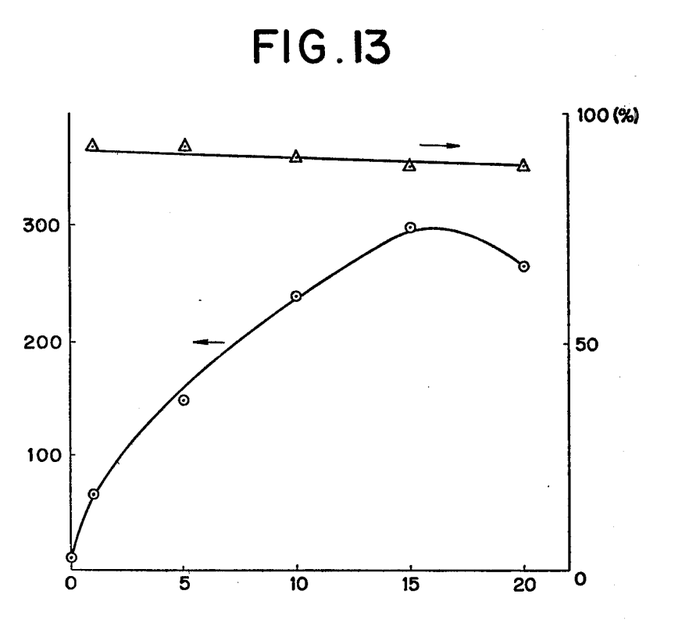
FIG. 13 is a graph showing the effectiveness of using varios amounts of sensitizer in the light sensitive compositions of the present invention.

100 Parts by weight of polymethyl isopropenyl ketone of a molecular weight of 176,000 were dissolved in cyclohexanone to obtain a solution of a concentration of 10 weight %. To the solution was then added various amounts of p-methoxybenzoic acid to obtain solutions containing 1–35 parts by weight of p-mehoxybenzoic acid. The solutions were filtrated through a 0.2 μm filter to obtain sensitizing solutions. Each of the sensitizing solutions was applied to a silicon wafer with a spinner. A resist layer having a thickness of about 0.5 μm was thus formed thereon. It was baked at 80° C. for 30 minutes to remove the solvent completely. The photosensitive materials thus obtained were exposed stepwise with a commercially available germicidal lamp which radiates ultraviolet rays of 253.7 nm wavelength, from a distance of 5.5 cm. Then, the resulting silicon wafer was immersed in a developing solution comprising a solvent mixture of ethyl cellosolve and cyclohexanone for one minute to effect the development, washed with water for one minute and dried. The sensitivity was determined from number of residual steps. The remaining rate of the film in the nonexposed parts was also measured. The results are shown in FIG. 13. The sensitivity is shown by relative values based on the sensitivity (10) of polymethyl isopenyl ketone. The remaining rate of the film was hardly changed. The light sensitive composition thus exhibited ideal properties.

EXAMPLE 4

10 Parts by weight of p-methoxybenzoic acid, per 100 parts by weight of polymethyl isopropenylketone, were added to a 10 weight % solution of polymethyl isopro- penyl ketone having a molecular weight of 176,000 in cyclohexanone to obtain a sensitizing solution. The sensitizing solution was applied to a silicon wafer with a spinner and baked at 80° C. for 30 minutes to obtain a resist layer having a thickness of about 0.5 μm. Thereafter, a quartz mask pattern was applied closely to the resist layer. After exposure with the same germicidal lamp as employed in Example 1 for two minutes, it was immersed in the same developing solution as employed in Example 1 for one minute to effect the development. After washing with water for one minute followed by drying, a very accurate ultrafine pattern of 0.5 μm was obtained.

The silicon wafer having the thus formed pattern was baked at 130° C. for 20 minutes and then treated with an etching solution containing hydrogen fluoride and ammonium fluoride (weight ratio 1;6) for 11 minutes.

Thus, an etching pattern consistent with the mask pattern could be obtained.

We claim:

1. A light sensitive composition consisting essentially of (1) polymethyl isopropenyl ketone of a molecular weight of about 10,000–about 1,000,000 and (2) from 0.1 to 50 parts by weight per 100 parts by weight of the polymethyl isopropenyl ketone of a compound having the general formula:

wherein $X_1$, $X_2$ and $X_3$ independently represent hydrogen atom, an alkyl group, hydroxyl group, an alkoxyl group or a halogen atom, Y represents hydrogen atom or a group having the formula —COOR, R being hydrogen atom or an alkyl group; Q represents hydrogen atom, an alkyl group or a lower hydrocarbon chain which may be substituted with hydroxyl group and n represents an integer of at least 1.

2. A light sensitive composition according to claim (1) wherein $X_1$ in general formula (I) represents hydrogen atom or an alkyl group, $X_2$, $X_3$, Y and Q each represent hydrogen atom and n represents 1.

3. A light sensitive composition according to claim (2) wherein $X_1$ in general formula (I) represents an alkyl group of 1-8 carbon atoms.

4. A light sensitive composition according to claim (1) wherein $X_1$ in general formula (I) represents hydroxyl group, $X_2$ and $X_3$ independently represent hydrogen atom or hydroxyl group, Q represents hydrogen atom or an alkyl group, Y represents hydrogen atom and n represents 1.

5. A light sensitive composition according to claim (4) wherein Q in general formula (I) represents an alkyl group of 1-5 carbon atoms.

6. A light sensitive composition according to claim (1) wherein $X_1$ in general formula (I) represents an alkoxyl group, $X_2$ represents hydrogen atom or an alkoxyl group, $X_3$, Y and Q represent hydrogen atom, and n represents 1.

7. A light sensitive composition according to claim 6 wherein $X_1$ in general formula (I) represents an alkoxyl group of 1-5 carbon atoms and $X_2$ represents hydrogen atom or an alkoxyl group of 1-5 carbon atoms.

8. A light sensitive composition according to claim (1) wherein $X_1$ in general formula (I) represents a halogen atom, $X_2$ represents hydrogen atom or a halogen atom, $X_3$, Y and Q each represent hydrogen atom and n represents 1.

9. A light sensitive composition according to claim (8) wherein $X_1$ in general formula (I) represents chlorine atom or bromine atom.

10. A light sensitive composition according to claim (9) wherein $X_2$ in general formula (I) represents chlorine atom or bromine atom.

11. A light sensitive composition according to claim (1) wherein $X_1$, $X_2$ and $X_3$ in general formula (I) each represent hydrogen atom, Y represents —COOR, Q and R independently represent hydrogen atom or an alkyl group and n represents 1.

12. A light sensitive composition according to claim (11) wherein $X_1$, $X_2$ and $X_3$ each represent hydrogen atom, Y represents —COOR group and R and Q independently represent an alkyl group of 1-8 carbon atoms.

13. A light sensitive composition according to claim (1) wherin $X_1$ in general formula (I) represents an alkyl group, and $X_2$, $X_3$ and Y represents hydrogen atom.

14. A light sensitive composition according to claim (13) wherein $X_1$ in general formula (I) represents an alkyl group of 1-8 carbon atoms.

15. A light sensitive composition according to claim (14) wherein Q in general formula (I) represents an alkyl group of 1-12 carbon atoms.

16. A light sensitive composition according to claim (14) wherein Q in general formula (I) represents a hydrocarbon chain of 2-5 carbon atoms which may be substituted with hydroxyl group and n represents an integer of 2-4.

17. A light sensitive composition according to claim (1) wherein $X_1$ and $X_2$ in general formula (I) independently represent an alkoxyl group, and $X_3$ and Y represent hydrogen atom.

18. A light sensitive composition according to claim (17) wherein $X_1$ and $X_2$ in general formula (I) independently represent an alkoxyl group of 1-5 carbon atoms.

19. A light sensitive composition according to claim (18) wherein Q in general formula (I) represents an alkyl group of 1-12 carbon atoms.

20. A light sensitive composition according to claim (18) wherein Q in general formula (I) represents a hydrocarbon chain of 2-5 carbon atoms which may be substituted with hydroxyl group, and n represents an integer of 2-4.

21. A composition according to claim (1) wherein the compound of general formula (I) is selected from the group consisting of benzoic acid, o-methylbenzoic acid, m-methylbenzoic acid, p-methylbenzoic acid, p-isopropylbenzoic acid, p-n-butylbenzoic acid, p-tert.-butylbenzoic acid, p-n-amylbenzoic acid, p-n-octylbenzoic acid, p-hydroxybenzoic acid, methyl p-hydroxybenzoate, dodecyl p-hydroxybenzoate, 2,4-dihydroxybenzoic acid, 3,4-dihydroxybenzoic acid, 3,4-dihydroxybenzoic acid, ethyl gallate, propyl gallate, isoamyl gallate, o-methoxybenzoic acid, p-methoxybenzoic acid, 3,4-dimethoxybenzoic acid, p-ethoxybenzoic acid, p-n-amyloxybenzoic acid, p-chlorobenzoic acid, 2,4-dichlorobenzoic acid, 3,4-dichlorobenzoic acid, p-bromobenzoic acid, terephthalic acid, dimethyl terephthalate, dodecyl p-tert.-butylbenzoate, ethylene glycol diester of p-tert.-butylbenzoic acid, propylene glycol diester of the same acid, 1,4-butanediol diester of the same acid, glycerol diester and triester of the same acid, pentaerythritol diester, triester and tetraester of the same acid, dodecyl ester of 3,4-dimethoxybenzoic acid, ethylene glycol diester of the same acid, propylene glycol diester of the same acid, 1,4-butanediol diester of the same acid, glycerol diester and triester of the same acid, and pentaerythritol diester, triester and tetraester of the same acid.

22. A light sensitive composition according to any of claims 1 to 21 wherein the amount of the compound of general formula (I) is from 1 to 25 parts by weight.

* * * * *

UNITED STATES PATENT AND TRADEMARK OFFICE
CERTIFICATE OF CORRECTION

PATENT NO. : 4,243,740
DATED : January 6, 1981
INVENTOR(S) : TSUDA ET AL

It is certified that error appears in the above–identified patent and that said Letters Patent are hereby corrected as shown below:

Column 2, line 15, in formula (I), "q" should read --Q--.
Column 2, line 37, "varios" should read --various--.
Column 3, line 15, in formula (I), "q" should read --Q--.
Column 3, line 36, "p-n.amyl" should read --p-n.-amyl--.
Column 7, TABLE 1, No. 15, "Dedecyl" should read --Dodecyl--.
Column 7, TABLE 1, No. 36, "butylbenxoic" should read --butylbenzoic--. Column 7, TABLE 1, No. 45, "dimethoxybenzoid" should read --dimethoxybenzoic--. Column 8, line 2, delete "the photo-sensitive,". Column 8, line 4, "xenen" should read --xenon--. Column 8, line 17, "indicatied" should read --indicated--. Column 8, line 67, "isopropenylketone" should read --isopropenyl ketone--. Column 9, line 17, "1;6 should read --1:6--. Column 9, line 30, in general formula (I), "q" should read --Q--.

Signed and Sealed this

Fifteenth Day of March 1983

[SEAL]

Attest:

GERALD J. MOSSINGHOFF

Attesting Officer

Commissioner of Patents and Trademarks